United States Patent
Saint-Marcoux et al.

(10) Patent No.: US 10,222,428 B2
(45) Date of Patent: Mar. 5, 2019

(54) METHOD FOR MANAGING THE OPERATING RANGE OF A BATTERY

(71) Applicant: RENAULT s.a.s., Boulogne-Billancourt (FR)

(72) Inventors: Antoine Saint-Marcoux, Palaiseau (FR); Bruno Delobel, Paris (FR)

(73) Assignee: RENAULT s.a.s., Boulogne-Billancourt (FR)

( * ) Notice: Subject to any disclaimer, the term of this patent is extended or adjusted under 35 U.S.C. 154(b) by 5 days.

(21) Appl. No.: 15/510,083

(22) PCT Filed: Sep. 2, 2015

(86) PCT No.: PCT/FR2015/052318
§ 371 (c)(1),
(2) Date: Mar. 9, 2017

(87) PCT Pub. No.: WO2016/038276
PCT Pub. Date: Mar. 17, 2016

(65) Prior Publication Data
US 2017/0299660 A1 Oct. 19, 2017

(30) Foreign Application Priority Data

Sep. 10, 2014 (FR) .................... 14 58508

(51) Int. Cl.
*H01M 6/50* (2006.01)
*G01R 31/36* (2019.01)
(Continued)

(52) U.S. Cl.
CPC .......... *G01R 31/3679* (2013.01); *B60L 11/14* (2013.01); *B60L 11/1805* (2013.01);
(Continued)

(58) Field of Classification Search
CPC .................................... H01M 10/48
See application file for complete search history.

(56) References Cited

U.S. PATENT DOCUMENTS

| 9,316,693 | B2* | 4/2016 | Benjamin | G01R 31/3606 |
| 2007/0148532 | A1* | 6/2007 | Lim | G01R 31/361 |
| | | | | 429/50 |

(Continued)

FOREIGN PATENT DOCUMENTS

JP 2014-96958 A 5/2014

OTHER PUBLICATIONS

International Search Report dated Nov. 12, 2015, in PCT/FR2015/052318 filed Sep. 2, 2015.

(Continued)

*Primary Examiner* — Abdullah Riyami
*Assistant Examiner* — Nader Alhawamdeh
(74) *Attorney, Agent, or Firm* — Oblon, McClelland, Maier & Neutadt, L.L.P.

(57) ABSTRACT

A method for managing an authorized operating range of a battery, the authorized operating range being limited between a minimum level and a maximum level of state of charge of the battery. The method includes estimating a state of health in power of the battery, the state of health in power characterizing capacity of the battery to supply a minimum required power level across an entirety of the operating range; and determining the minimum level of state of charge of the battery in accordance with the estimated state of health in power, the minimum level of state of charge being increased when the state of health in power decreases.

8 Claims, 3 Drawing Sheets

(51) Int. Cl.
*B60L 11/14* (2006.01)
*B60L 11/18* (2006.01)
*H01M 10/44* (2006.01)
*H02J 7/00* (2006.01)
*H01M 10/42* (2006.01)
*B60R 16/033* (2006.01)
*H01M 10/48* (2006.01)

(52) U.S. Cl.
CPC ....... *B60L 11/1857* (2013.01); *B60L 11/1859* (2013.01); *B60L 11/1861* (2013.01); *B60L 11/1862* (2013.01); *B60L 11/1864* (2013.01); *B60R 16/033* (2013.01); *G01R 31/3606* (2013.01); *G01R 31/3637* (2013.01); *G01R 31/3662* (2013.01); *H01M 10/42* (2013.01); *H01M 10/425* (2013.01); *H01M 10/44* (2013.01); *H01M 10/48* (2013.01); *H02J 7/00* (2013.01); *H02J 7/0029* (2013.01); *B60L 2240/545* (2013.01); *B60L 2240/547* (2013.01); *B60L 2240/549* (2013.01); *B60L 2240/80* (2013.01); *B60L 2260/42* (2013.01); *B60L 2260/44* (2013.01); *H01M 2010/4271* (2013.01); *H01M 2220/20* (2013.01); *H02J 2007/004* (2013.01); *H02J 2007/0037* (2013.01); *Y02T 10/70* (2013.01); *Y02T 10/7011* (2013.01); *Y02T 10/7044* (2013.01); *Y02T 10/7061* (2013.01); *Y02T 10/7077* (2013.01)

(56) References Cited

U.S. PATENT DOCUMENTS

| | | | | |
|---|---|---|---|---|
| 2011/0313613 A1* | 12/2011 | Kawahara | ........... | H01M 10/441 701/34.4 |
| 2012/0112754 A1* | 5/2012 | Kawai | ................ | G01R 31/3651 324/428 |
| 2012/0208672 A1* | 8/2012 | Sujan | ................... | B60W 10/02 477/5 |
| 2013/0184908 A1 | 7/2013 | Sujan et al. | | |
| 2013/0184909 A1 | 7/2013 | Sujan et al. | | |
| 2013/0184910 A1 | 7/2013 | Sujan et al. | | |
| 2013/0184911 A1 | 7/2013 | Sujan et al. | | |
| 2013/0184912 A1 | 7/2013 | Sujan et al. | | |
| 2013/0184913 A1* | 7/2013 | Sujan | ................... | B60W 10/02 701/22 |
| 2013/0184914 A1 | 7/2013 | Sujan et al. | | |
| 2013/0229154 A1* | 9/2013 | Benjamin | .......... | G01R 31/3606 320/132 |
| 2014/0217976 A1* | 8/2014 | McGrath | ............. | B60L 11/1837 320/109 |
| 2014/0287278 A1* | 9/2014 | Despesse | ............ | H01M 2/1072 429/7 |
| 2014/0302355 A1* | 10/2014 | Boehm | ................. | B60L 3/0046 429/50 |
| 2015/0061687 A1* | 3/2015 | Shim | .................. | G01R 31/3679 324/426 |
| 2015/0188198 A1* | 7/2015 | Bonhomme | .......... | H01M 10/48 429/61 |
| 2015/0239364 A1* | 8/2015 | Baughman | ........... | G07C 5/0841 701/33.4 |
| 2015/0291050 A1 | 10/2015 | Luo et al. | | |
| 2015/0291150 A1 | 10/2015 | Sujan et al. | | |
| 2016/0052423 A1* | 2/2016 | Zhou | ....................... | B60L 15/06 701/22 |
| 2016/0176311 A1* | 6/2016 | Liggins | ................. | B60K 35/00 324/435 |
| 2016/0218511 A1* | 7/2016 | Li | .............................. | H02J 3/32 |
| 2016/0221465 A1* | 8/2016 | Kratzer | .................... | B60L 3/12 |
| 2017/0299660 A1* | 10/2017 | Saint-Marcoux | ........................... | G01R 31/3679 |

OTHER PUBLICATIONS

French Search Report dated May 22, 2015, in French Patent Application FR 1458508 filed Sep. 10, 2014.
Anonymous: "State of Health—Wikipeclia, the free encyclopedia", (Mar. 7, 2014), 3 pages, XP055191086.
Spotnitz, "Simulation of capacity fade in lithium-ion batteries", Journal of Power Sources, vol. 113, No. 1, (Jan. 1, 2003), pp. 72-80, XP004399047.

* cited by examiner

METHOD FOR MANAGING THE OPERATING RANGE OF A BATTERY

BACKGROUND

The invention relates to a method for managing the operating range of an electric accumulator battery.

One field of application envisioned is in particular, but not exclusively, the management of lithium-ion batteries used in electric, hybrid or rechargeable hybrid vehicles. This type of battery comprises a plurality of electric accumulators or cells, including a rechargeable electrochemical system designed to supply a nominal voltage.

The operating range of the battery corresponds to the permissible range of state of charge for the battery, in terms of both charge and discharge. This operating range is characterized, on the one hand, by a maximum state of charge, corresponding to a state of charge above which the battery is not permitted to rise, and, on the other hand, by a minimum state of charge, below which the battery is not permitted to drop.

The maximum permissible state of charge is defined by the end-of-charge voltage or cutoff voltage, which may, for example, be measured across the terminals of the battery. This voltage is in effect representative of the charging limit of the cells that form the battery. In other words, it is the value that the maximum voltage across the terminals of each cell must reach at the end of charging in order to judge that charging has in fact finished. A high end-of-charge voltage increases the energy available at the start of life of the battery, but, in contrast, brings about faster ageing of the battery. Thus, in order to manage the end-of-charge voltage, it is necessary to find a compromise between the energy level provided by the battery in the short term and the durability of the battery.

It will be seen that the problem of managing the minimum state of charge of the battery is just as acute. In effect, if the minimum state of charge is too high, the energy available for the user will not be at the desired level with respect to a required minimum energy level, whereas, if it is too low, in certain instances of use, in particular in conditions involving cold temperatures, the battery risks being at a level of state of charge at which it will not be able to supply the required minimum power level. Thus, in order to manage the minimum permissible state of charge for the battery, it is also necessary to find a compromise between the desired energy level that one wishes to ensure for the user and the available discharge power of the battery over the entire operating range of the battery, including when cold.

In terms of performance, the battery system, consisting primarily of the cells and the dedicated BMS (Battery Management System) computer, must therefore ensure a required minimum energy level, not only at the start of life but also after a certain number of years, and a required minimum power level, not only at the start of life, over the entire operating range, but also after a certain number of years.

Patent document WO2012074406 discloses a method for managing the charging of a battery of an electric vehicle, wherein the BMS is able to determine a modifiable charging algorithm intended to be provided to the charger in order to ensure charging of the battery in such a way as to adapt the charging as a function of different conditions, such as temperature, electric network and type of charger. This method makes it possible to charge the battery to a desired energy level in nominal conditions. However, said method does not allow management of all of the causes of "dispersion" that can influence the available energy level. In effect, one of the difficulties lies in the fact that, for a predetermined end-of-charge voltage, the energy available for a user is not the same, in line primarily with three factors:

- the temperature of the battery: thus, the lower the temperature of the battery, the smaller the amount of energy that can be discharged from this end-of-charge voltage, as the internal resistances of the cells are greater;
- the ageing of the battery: the more degraded the state of health of the battery, the smaller the amount of energy that can be discharged from this end-of-charge voltage, as the capacity available (in A.h) in the battery is limited;
- the cell imbalance, defined as being the difference between the state of charge of the cell having the highest charge and the state of charge of the cell having the lowest charge: thus, the greater the cell imbalance, the smaller the amount of energy that can be discharged from this end-of-charge voltage, because the lowest cell will reach its limit end-of-discharge voltage (minimum state of charge) earlier than the other cells.

BRIEF SUMMARY

Therefore, one problem that arises and that the present invention aims to solve is to provide a method for managing the operating range of the battery, making it possible to ensure the strictly necessary required minimum energy level and required minimum power level, in line with the ageing of the battery.

To this end, the present invention provides a method for managing a permissible operating range of a battery, said permissible operating range being bounded between a minimum level and a maximum level of state of charge of the battery, said method comprising a step of estimating a state of health in terms of power of said battery, said state of health in terms of power characterizing the capacity of the battery to supply a required minimum power level over the entirety of said operating range, said method being characterized in that it furthermore comprises a step of determining said minimum level of state of charge of said battery as a function of said estimated state of health in terms of power, said minimum level of state of charge being increased when the state of health in terms of power decreases.

Thus, by virtue of this modulation of the minimum permissible level of state of charge as a function of the state of health in terms of power of the battery, it is possible to compensate for the progressive reduction, with ageing, of the permissible discharge power for the battery.

Advantageously, the method can furthermore comprise a step of determining said maximum level of state of charge of said battery as a function of said estimated state of health in terms of power of said battery, said maximum level of state of charge being increased when the state of health in terms of power decreases. This advantageously makes it possible to compensate for the progressive reduction of the permissible discharge power with ageing.

Advantageously, so as to compensate for the loss of capacity of the battery, the method can also comprise steps of:

estimating a state of health in terms of energy of said battery, said state of health in terms of energy characterizing the capacity of said battery to supply a required minimum energy level over the entirety of said operating range;

determining said maximum level of state of charge of said battery as a function of said estimated state of health in terms of energy of said battery, said maximum level of state of charge being increased when the state of health in terms of energy decreases.

According to another advantageous feature, the method can comprise a step including reducing said minimum level of state of charge of said battery at the start of life of said battery, so as to make it possible to guarantee the strictly necessary required minimum power level over the entire lifetime of the battery.

According to another advantageous feature, the method can also comprise a step including reducing said maximum level of state of charge of said battery at the start of life of said battery, so as to make it possible to limit the degradation of the battery at the start of life by limiting its operating range.

Advantageously, the estimation of said state of health in terms of power of said battery includes comparing the internal resistance of the battery in given temperature and state of charge conditions with the value of said internal resistance in said conditions when the battery is new.

According to another aspect, the invention relates to a computer program comprising instructions for carrying out the steps of the method of the invention when these instructions are executed by a processor.

The method for managing the operating range of the battery, described above, can be implemented by digital processing means, for example a microprocessor, a microcontroller, or another means. It can advantageously be implemented by the dedicated battery system computer (BMS).

Also provided is a device for managing a permissible operating range of a battery, said permissible operating range being bounded between a minimum level and a maximum level of state of charge of the battery, said device comprising means for estimating a state of health in terms of power of said battery, said state of health in terms of power characterizing the capacity of said battery to supply a required minimum power level over the entirety of said operating range, and processing means able to determine said minimum level of state of charge of said battery as a function of said estimated state of health in terms of power, such that said minimum level of state of charge increases when the state of health in terms of power of said battery decreases.

Advantageously, said processing means are able to determine said maximum level of state of charge of said battery as a function of said estimated state of health in terms of power of said battery, such that said maximum level of state of charge increases when the state of health in terms of power of said battery decreases.

Preferably, the device comprises means for estimating a state of health in terms of energy of said battery, said state of health in terms of energy characterizing the capacity of said battery to supply a required minimum energy level over the entirety of said operating range, said processing means being able to determine said maximum level of state of charge of said battery as a function of said estimated state of health in terms of energy of said battery, such that said maximum level of state of charge increases when the state of health in terms of energy of said battery decreases.

This device can for example comprise or be integrated into one or a plurality of processors.

The invention also relates to a motor vehicle comprising a battery and the device for managing the permissible operating range of said battery, such as described above.

BRIEF DESCRIPTION OF THE DRAWINGS

Other features and advantages of the invention will emerge clearly from the description thereof given hereinafter of one particular embodiment of the invention, given by way of wholly nonlimiting indication, with reference to the appended drawings, in which.

DETAILED DESCRIPTION

Figure 1:
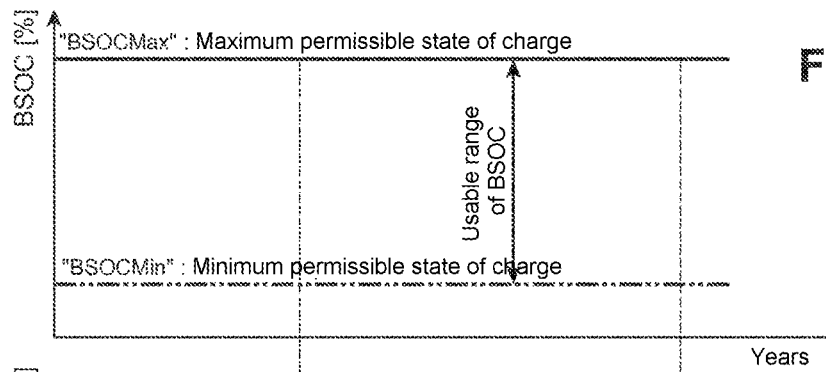
FIG. 1 shows an example of graphs illustrating a permissible operating range of the so-called reference battery, as a function of the ageing of the battery, and illustrating in parallel, also as a function of this ageing, the energy available for the user at ambient temperature (for example 25° C.), as well as the power available at the minimum permissible level of state of charge when cold.

The variables that will be used in the remainder of the description are listed below:

N: the number of cells in the battery.

$V_{cell}^i$: the voltage of the i-th cell—unit [V], $V_{cell}^{max} = \max(V_{cell}^i, i \in 1 \ldots N)$: the maximum cell voltage—unit [V], $V_{cell}^{min} = \max(V_{cell}^i, i \in 1 \ldots N)$: the minimum cell voltage—unit [V], BSOC: the state of charge of the battery (SOC for State Of Charge)—unit [%], OCV: the no-load voltage of the cell—unit [V]. To given values of BSOC and temperature there corresponds to an OCV level.

$BSOC_{min}$: the minimum level of state of charge, below which the battery is not permitted to drop—unit [%], $BSOC_{max}$: the maximum level of state of maximum charge, above which the battery is not permitted to rise—unit [%], $Q_{max}$: the total capacity of the battery—unit [A.h.], SOHE: the state of health in terms of energy of the battery—unit [%]. The state of health in terms of energy indicates the capacity of the battery to supply a required minimum energy level and is defined hereinafter as being the ratio between, on the one hand, the energy that can be discharged with the battery fully charged, at a reference temperature (for example 25° C.), at a constant reference current level (for example 1 C), until a cutoff voltage is reached (for example 2.5 V) at a given time of life of the battery and, on the other hand, the energy that can be discharged with the battery in the same conditions when it is new. Thus, at the start of life, this ratio is 100%, and it decreases gradually. In effect, during the lifetime of a battery, its health (its performance) tends to deteriorate progressively as a result of irreversible physical and chemical changes that take place during use and ageing, until eventually the battery can no longer be used. The SOHE thus reflects a state of health of the battery and its capacity to supply the specified performance in terms of energy available with respect to a new battery.

$DCR_{cell}^i$: the internal resistance of the cell—unit [ohm].

SOHP: the state of health in terms of power of the battery—unit [%]. The state of health in terms of power indicates the capacity of the battery to supply a required minimum power level and is defined hereinafter as being the ratio between, on the one hand, the internal resistance at 10 seconds of the battery at a reference temperature (for example −20° C.), at a reference state of charge (for example BSOC=20%), at a given time of life of the battery and, on the other hand, the internal resistance in the same conditions when the battery is new. Thus, at the start of life, this ratio is 100%, and it decreases gradually (at least beyond a certain level of ageing of the battery). The SOHP thus reflects a state of health of the battery and its capacity to supply the specified performance in terms this time of permissible available discharge power for the battery with respect to a new battery.

The BMS system defines, at all times, a permissible operating range for the battery, the latter possibly being able to depend on the temperature. By default, as illustrated in the graph in FIG. 1, it can initially be considered that this permissible operating range, bounded between the minimum $BSOC_{min}$ and maximum $BSOC_{max}$ levels of state of charge, does not vary as a function of the ageing of the battery. In other words, the minimum $BSOC_{min}$ and maximum $BSOC_{max}$ permissible levels of state of charge remain fixed as a function of the ageing of the battery.

In this case, if the capacity of the battery is sized in order to simultaneously guarantee the required minimum energy level at ambient temperature for a minimum period (typically 2 years) and the required minimum power level at $BSOC_{min}$ when cold (typically at −20° C.), then, at the start of life of the battery, it is found, as illustrated in the graphs in FIG. 1, that the user has both a surplus of power available at $BSOC_{min}$ when cold (typically at −20° C.) and a surplus of energy available at ambient temperature.

Figure 2:
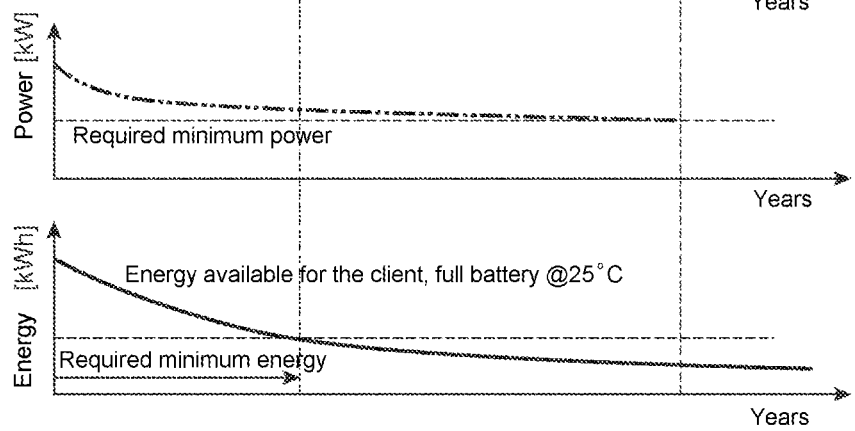
FIG. 2 repeats the graphs from FIG. 1, illustrating an example of managing the permissible operating range of the battery that makes it possible to supply the strictly necessary desired performance level (available energy and available power) according to a first approach of the invention.

Thus, as illustrated in the graphs in FIG. 2, a first way of optimizing the management of the operating range of the battery consists in defining a lower level of $BSOC_{min}$ at the start of life of the battery in order to guarantee the strictly necessary required minimum power level over the entire lifetime of the battery. In addition to this approach, it is also possible to reduce $BSOC_{max}$ while keeping the same energy level available for the user with respect to the configuration of the operating range of the battery illustrated in FIG. 1. This reduction of the maximum permissible level of state of charge makes it possible to improve the durability of the battery significantly, since, at least at the start of life of the battery, the battery will spend less time in a high state of charge (which, in practice, degrades the battery). In contrast, at the start of life of the battery, as illustrated in the graph in FIG. 2 showing the energy available for the user at ambient temperature as a function of ageing, the user will potentially still have an unnecessary surplus of energy available with respect to the required minimum energy level. Thus, although this first way of optimization makes it possible to guarantee the strictly necessary desired performance level in terms of available power with respect to the required minimum power level over the entire lifetime of the battery, it does not, however, make it possible to supply the desired performance level in terms of strictly necessary available energy with respect to the required minimum energy level.

Figure 3:
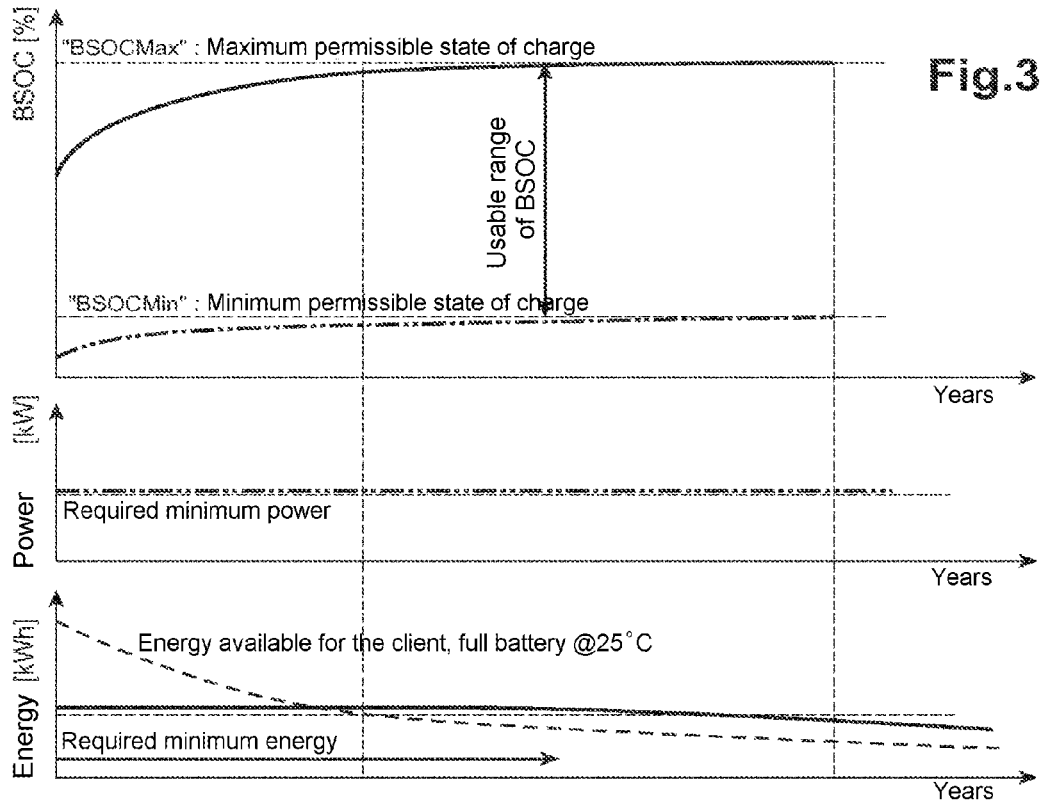
FIG. 3 repeats the graphs from FIG. 1, illustrating an example of managing the permissible operating range of the battery according to a second approach of the invention, which can be combined with the first approach.

Thus, as illustrated in the graphs in FIG. 3, a second way of optimizing the management of the operating range of the battery consists in additionally reducing $BSOC_{max}$ at the start of life of the battery in order to guarantee the strictly necessary available energy for the user with respect to the required minimum energy level over the entire lifetime of the battery. This additional reduction of the maximum permissible level of state of charge makes it possible to improve the durability of the battery, since, at least at the start of life of the battery, the latter will spend even less time of time in a high state of charge (which, in practice, degrades the battery). This second way of optimization can be combined with the first way of optimization set forth above, for an additional gain in the durability of the battery.

With respect to the foregoing, according to one preferred embodiment, the BMS system is therefore designed to implement logic for modulating the minimum permissible level of state of charge of the battery: $BSOC_{min}$ as a function of the state of health in terms of power of the battery SOHP, so as to compensate for the progressive reduction of the permissible discharge power for the battery with ageing. More precisely, the minimum permissible level of state of charge is increased as a function of the increasing state of ageing of the battery, up to a limit value in order to ensure the required minimum power level over the entire lifetime of the battery. As indicated in FIGS. 2 and 3, the more the battery ages, the more it is necessary to increase the minimum level of state of charge $BSOC_{min}$ in order to compensate for the loss of available discharge power. In other words, the minimum level of state of charge increases when the state of health in terms of power of the battery decreases.

Furthermore, the BMS system is preferably designed to implement logic for modulating the maximum permissible level of state of charge of the battery $BSOC_{max}$ as a function of the state of health in terms of energy of the battery SOHE, so as to compensate for the loss of total capacity of the battery and thus maintain a required minimum energy level over a sufficiently long period while preserving durability.

Figure 4:
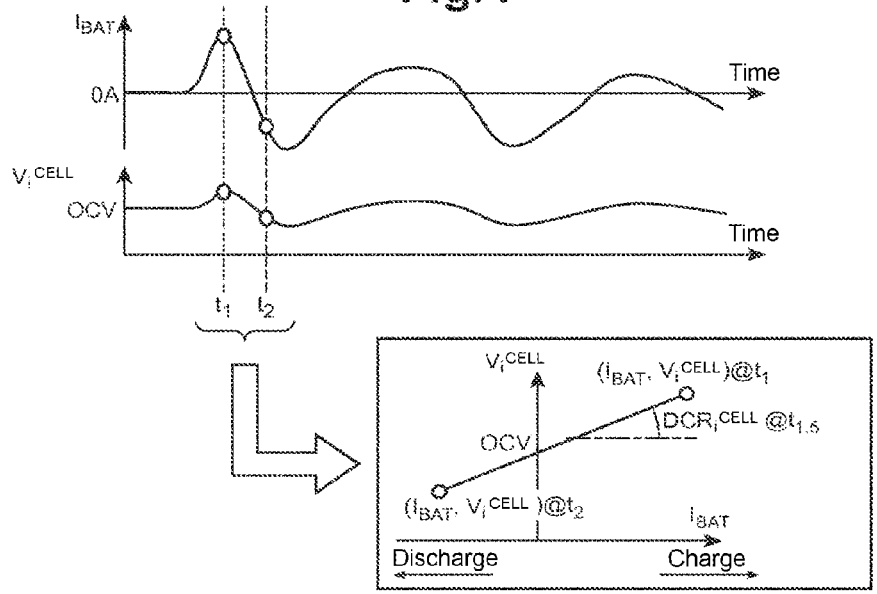
FIG. 4 shows a graph illustrating an embodiment for estimating the state of health in terms of power of the battery.

Thus, the minimum level of state of charge below which the battery is not permitted to drop is managed, according to the invention, on the basis of the calculation of the state of health in terms of power of the battery, which depends on ageing. The general principle of the calculation of the state of health in terms of power of the battery is described with reference to FIG. 4. Thus, the variation of the current $\Delta I_{bat}$ during a period of time bounded between the times $t_1$ and $t_2$, for example equal to 10 seconds, is compared with the variation of the cell voltage $\Delta V_{cell}$. The ratio between these two variations thus corresponds to the apparent resistance of the cell $RESISTANCE_{cell}^{apparent}$. It will be rioted that, if this resistance is determined over a specific frequency range, reference will be made instead to cell impedance. On the basis of this information, the BMS system is provided in order to compare this apparent resistance with the value of the internal resistance that this cell would have had if it had been new, $RESISTANCE_{cell}^{NEW}$, in the same conditions. In practice, the BMS system thus calculates the state of health in terms of power of the battery SOHP in the following manner:

$$SOHP = \frac{RESISTANCE_{cell}^{NEW}}{RESISTANCE_{cell}^{apparent}},$$

which thus defines a ratio that characterizes the increase in the internal resistance of the cell.

It will be possible to choose to determine a single value of SOHP that is valid over the entire temperature and state of charge range, or else it will be possible to choose to determine values of SOHP as a function of the battery temperature.

The BMS system is thus provided in order to determine the minimum permissible level of state of charge for the battery as a function of the state of health in terms of power of the battery thus estimated.

The available discharge power corresponds to the maximum value of power that the battery knows to supply, on the one hand, without dropping below a cutoff voltage level $V_{min}$ and, on the other hand, without exceeding a maximum discharge current $I_{bat\_max}$.

Thus, mathematically, the available discharge power from a level of state of charge can be calculated in the following manner:

$$\text{Available Power} = \min\left(V_{min} \cdot \frac{OCV - V_{min}}{DCR}, (OCV - DCR \cdot I_{bat\_max}) \cdot I_{bat\_MAX}\right)$$

Figure 5:
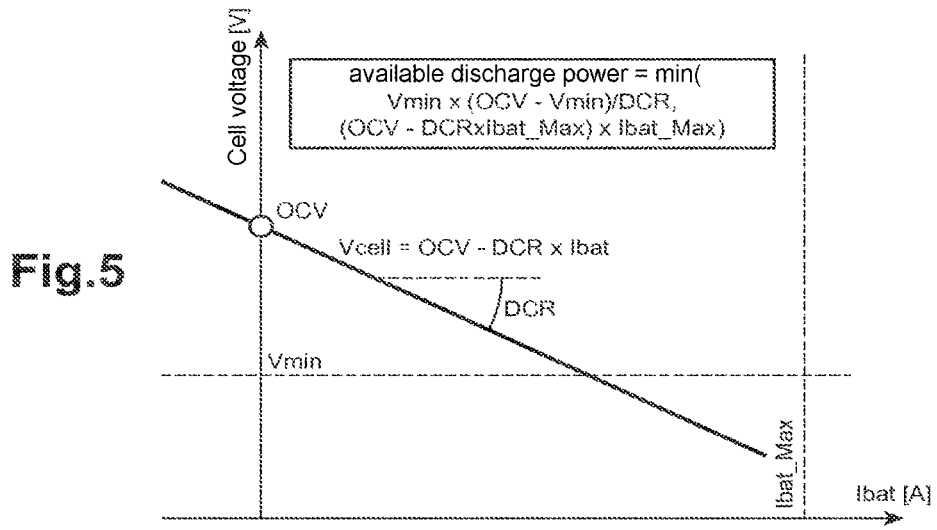
FIG. 5 shows a graph illustrating an embodiment for determining the available discharge power of the battery.

Thus, as illustrated with reference to FIG. 5, the available discharge power is directly dependent on the internal resistance of the battery. If the state of health 2Q in terms of power SOHP of the battery is taken into consideration, as well as the level of internal resistance of the battery at the start of life $DCR_{BOL}$, the following is obtained:

$$\text{Available Power} = \min\left(V_{min} \cdot \frac{OCV - V_{min}}{\frac{DCR_{BOL}}{SOHP}}, \left(OCV - \frac{DCR_{BOL}}{SOHP} \cdot I_{bat\_max}\right) \cdot I_{bat\_MAX}\right)$$

It appears that a reduction in the state of health in terms of power of the battery SOHP with the ageing of the battery results in a reduction of the available power for a given state of charge. Thus, for an aged battery, that is to say having an SOHP of less than 100%, in order to ensure the recurred minimum power level, it is necessary to increase the no-load voltage OCV and, consequently, increase the minimum level of state of charge $BSOC_{min}$.

Figure 6:
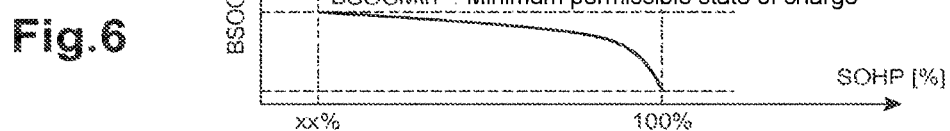
FIG. 6 shows a graph illustrating an example of a map of the minimum permissible level of state of charge as a function of the ageing of the battery.

Thus, at each temperature (a fortiori when cold), and for each level of SOHP, it is possible to determine the minimum level of state of charge $BSOC_{min}$, making it possible to ensure the required minimum power. As illustrated in FIG. 6, it is therefore possible to deduce therefrom a map of the minimum permissible level of state of charge $BSOC_{min}$ as a function of ageing and, more particularly, as a function of the progression of the state of health in terms of power of the battery SOHP, from which it appears that the minimum permissible level of state of charge increases when the state of health in terms of power of the battery decreases.

The BMS system is also provided in order to estimate the state of health in terms of energy of the battery SOHE. There are several methods for estimating the state of health in terms of energy of the battery. For this estimation, use may be made by way of example of one of the methods set forth in the patent "METHOD AND APPARATUS OF ESTIMATING STATE OF HEALTH OF BATTERY" (US2007/0001679 A1) or in the article "R. Spotnitz, "Simulation of capacity fade in lithium ion batteries", journal of Power Sources 113 (2003) 72-80".

Figure 7:
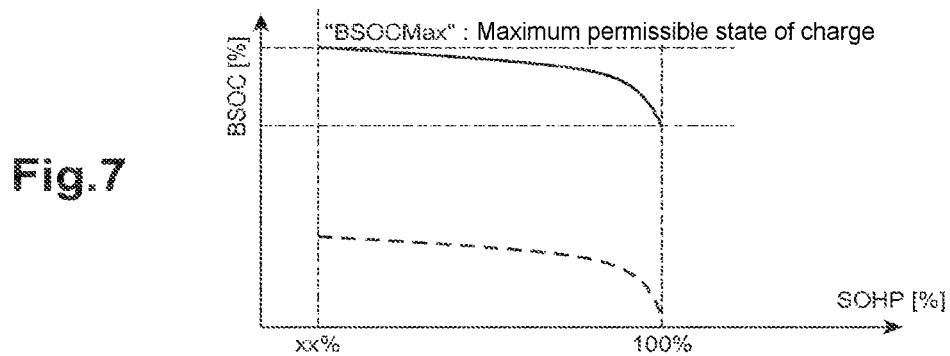
FIG. 7 shows a graph illustrating an example of a map of the maximum permissible level of state of charge as a function of the ageing of the battery.

It has been seen above that, in addition to the first way of optimization consisting of a modulation of the minimum permissible level of state of charge $BSOC_{min}$ as a function of the state of health in terms of power SOHP in order to guarantee the strictly necessary required minimum power level over the entire lifetime of the battery, it is also possible to modulate the maximum permissible level of state of charge $BSOC_{max}$ as a function of the state of health in terms of power SOHP, in order to keep the same amount of energy with respect to the configuration of the reference operating range illustrated in FIG. 1. As a first approximation, it can therefore be considered that it is desired to keep a constant state-of-charge gap between $BSOC_{max}$ and $BSOC_{min}$ over the entire lifetime of the battery, as illustrated in FIG. 7. Insofar as one ampere hour at a low state of charge contains more energy than one ampere hour at a high state of charge, it will be possible to modify this gap between $BSOC_{max}$ and $BSOC_{min}$ slightly, while retaining the principle of continuing to determine the maximum permissible level of state of charge $BSOC_{max}$ exclusively on the basis of the state of health in terms of power of the battery SOHP.

Figure 8:
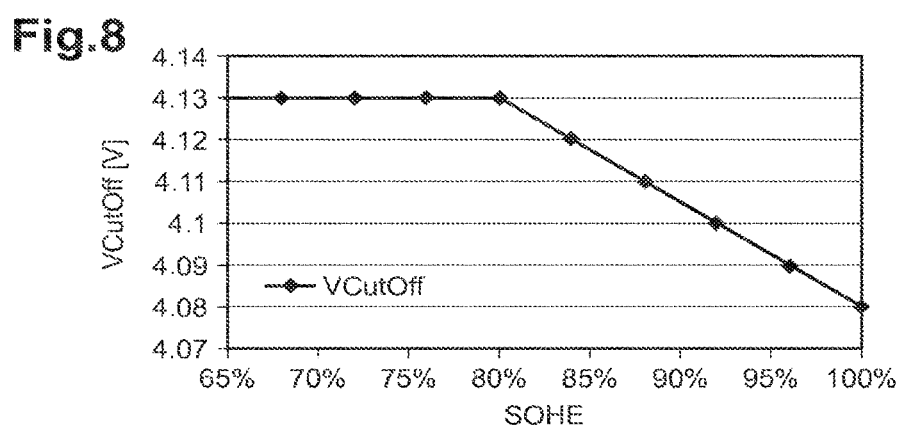
FIG. 8 shows a graph illustrating an example of determining the end-of-charge voltage as a function of the state of health in terms of energy of the battery.

In the context of the second way of optimizing the management of the operating range of the battery set forth above, the maximum permissible level of state of charge of the battery $BSOC_{max}$ is determined in order to ensure the strictly necessary required energy level. That is to say, it is no longer determined as a function of the state of health in terms of power of the battery SOHP, but as a function of the state of health in terms of energy of the battery SOHE. To do this, a map VcutOff=f(SOHE), implemented in the BMS, makes it possible to determine the end-of-charge voltage VCutOff on the basis of the SOHE estimated in the manner set forth above and makes it possible to compensate for the loss of capacity of the battery (reduction of the state of health in terms of energy of the battery SOHE) by increasing the end-of-charge voltage VCutOff, as illustrated in FIG. 8. Thus, the end-of-charge voltage and therefore the maximum permissible level of state of charge is increased as a function of the increasing state of ageing of the battery (decreasing state of health in terms of energy), up to a limit value in order to ensure the required, constant, minimum energy level over the entire lifetime of the battery.

The maximum permissible level of state of charge for the battery $BSOC_{max}$ can thus be determined not only as a function of the state of health in terms of energy of the battery SOHE, as has just been explained, but also as a function of the state of health in terms of power of the battery SOHP, this being done, as has been explained above, in order to take into consideration the fact that the minimum level of state of charge $BSOC_{min}$ increases in line with a reduction in the state of health in terms of power of the battery SOHP, and thus maintain the same energy level for the user with respect to the reference operating range. To do this, it may be useful to take into consideration the fact that a correlation exists between the progression of SOHP and of SOHE, this correlation being able to be determined empirically on the basis of (offline) tests performed on cells. In other words, in order to manage the maximum level of state of charge above which the battery is not permitted to rise, the BMS system is designed to implement logic for modulating the maximum permissible level of state of charge $BSOC_{max}$, either as a function of the calculation of SOHP only, or as a function of the calculation of SOHE only, or else as a function of a combination of the two (SOHP and SOHE).

The optimized strategy for the management of the operating range of the battery according to the invention thus makes it possible, at the start of life, to ensure the strictly necessary required minimum energy level and required minimum power level by constraining the battery (that is to say its operating range) to what is strictly necessary, for both the minimum permissible level of state of charge and the maximum permissible level of state of charge. During the initial years in which the vehicle is used, this strategy makes it possible to compensate for the loss of available discharge power by gradually increasing the minimum level of state of charge below which the battery is not permitted to drop. Furthermore, by limiting the operating range of the battery at the start of life and by gradually increasing the end-of-charge voltage (therefore the maximum permissible level of state of charge) as a function of ageing, it also makes it possible, during the initial years in which the vehicle is used, to compensate for the loss of capacity of the battery. This strategy advantageously makes it possible to mask the fact that the battery is degrading (in terms of available power and in terms of available energy), at least during the initial years, and also makes it possible to limit the degradation of the battery at the start of life, since it is used over a limited operating range (with a reduced end-of-charge voltage).

The invention claimed is:

1. A method for managing a permissible operating range of a battery, the permissible operating range being bounded between a minimum level and a maximum level of state of charge of the battery, the method comprising:
estimating a state of health in terms of power of the battery, the state of health in terms of power characterizing capacity of the battery to supply a required minimum power level over an entirety of the operating range;
determining the minimum level of state of charge of the battery as a function of the estimated state of health in terms of power, the minimum level of state of charge being increased when the state of health in terms of power decreases;
estimating a state of health in terms of energy of the battery, the state of health in terms of energy characterizing the capacity of the battery to supply a required minimum energy level over the entirety of the operating range; and
determining the maximum level of state of charge of the battery as a function of the estimated state of health in terms of energy of the battery, and increasing the maximum level of state of charge when the state of health in terms of energy decreases.

2. The method as claimed in claim 1, further comprising determining the maximum level of state of charge of the battery as a function of the estimated state of health in terms of power of the battery, the maximum level of state of charge being increased when the state of health in terms of power decreases.

3. The method as claimed in claim 1, further comprising reducing the minimum level of state of charge of the battery at a start of life of the battery.

4. The method as claimed in claim 1, further comprising reducing the maximum level of state of charge of the battery at a start of life of the battery.

5. The method as claimed in claim 1, wherein the estimating the state of health in terms of power of the battery includes comparing internal resistance of the battery at a given temperature and state of charge conditions with a value of the internal resistance in conditions when the battery is new.

6. A device for managing a permissible operating range of a battery, the permissible operating range being bounded between a minimum level and a maximum level of state of charge of the battery, the device comprising:
means for estimating a state of health in terms of power of the battery, the state of health in terms of power characterizing capacity of the battery to supply a required minimum power level over an entirety of the operating range;
processing means for determining the minimum level of state of charge of the battery as a function of the estimated state of health in terms of power, such that the minimum level of state of charge increases when the state of health in terms of power of the battery decreases; and
means for estimating the state of health in terms of energy of the battery, the state of health in terms of energy characterizing the capacity of the battery to supply the required minimum energy level over the entirety of the operating range,
wherein the processing means further determine the maximum level of state of charge of the battery as a function of the estimated state of health in terms of energy of the battery, such that the processing means increase the maximum level of state of charge when the state of health in terms of energy of the battery decreases.

7. The device as claimed in claim 6, the processing means further for determining the maximum level of state of charge of the battery as a function of the estimated state of health in terms of power of the battery, such that the maximum level of state of charge increases when the state of health in terms of power of the battery decreases.

8. A motor vehicle comprising a battery and a device for managing the permissible operating range of the battery as claimed in claim 6.

* * * * *